(12) United States Patent
Coehoorn

(10) Patent No.: US 6,580,270 B1
(45) Date of Patent: Jun. 17, 2003

(54) MAGNETORESISTIVE SENSOR OR MEMORY ELEMENTS WITH DECREASED MAGNETIC SWITCH FIELD

(75) Inventor: Reinder Coehoorn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 108 days.

(21) Appl. No.: 09/656,989

(22) Filed: Sep. 7, 2000

(30) Foreign Application Priority Data

Sep. 10, 1999 (EP) .............................. 99202945

(51) Int. Cl.$^7$ .................... G11B 5/147; G11C 11/18; G01R 33/09

(52) U.S. Cl. .................... 324/252; 365/158; 360/324.1; 360/324.12

(58) Field of Search ................. 324/207.21, 252; 338/32 R; 365/158; 360/126, 318, 324.1, 325, 324.12

(56) References Cited

U.S. PATENT DOCUMENTS

| | | | | |
|---|---|---|---|---|
| 4,356,523 A | * | 10/1982 | Yeh | 360/113 |
| 5,465,185 A | | 11/1995 | Heim et al. | 360/113 |
| 5,914,839 A | * | 6/1999 | Matsuzono et al. | 360/113 |

FOREIGN PATENT DOCUMENTS

WO      9908117 A2   2/1999

* cited by examiner

Primary Examiner—Edward Lefkowitz
Assistant Examiner—Reena Aurora
(74) Attorney, Agent, or Firm—Steven R. Biren

(57) ABSTRACT

A sensor (MRE) or memory element (ME) having a free (1, 2, 3) and a pinned ($M_p$, 6) magnetic layer separated by a separation layer (5). The free layer comprises a sandwich structure comprising two magnetic layers (1,2), coupled anti-ferromagneticallly by a thin non-magnetic layer (3), the easy magnetization direction for the two magnetic layers being directed transversely to the longitudinal axis (1) of the stripe.

6 Claims, 6 Drawing Sheets

MAGNETORESISTIVE SENSOR OR MEMORY ELEMENTS WITH DECREASED MAGNETIC SWITCH FIELD

BACKGROUND OF THE INVENTION

The invention relates to a device comprising an elongated field-sensitive ferromagnetic layer of which the magnetization is sensitive to an applied magnetic field. Within the concept of the invention 'elongated' means that layer has an elongated shape i.e. the dimension of the layer in a first direction (the 'length') is greater than the dimension (the 'width') in a direction perpendicular to the first direction. The first direction is commonly called the 'longitudinal direction'. The field-sensitive layer may be, for example, (part of) a flux guide or (part of) a magnetoresistive element. The field-sensitive layer may be the second layer of a device comprising a first and a second layer of ferromagnetic material separated by a spacer layer of non-ferromagnetic material, the first and second layer being formed such that the magnetization of the first ferromagnetic layer is maintained in a fixed or pinned direction in the presence of an applied magnetic field, while the magnetization direction of the second ferromagnetic layer is able to change in the presence of an applied magnetic field, the second layer comprising an elongated layer of magnetoresistive material, the device comprising means for directing a sensing current through the elongated layer in a current direction parallel to the longitudinal direction of the layer or perpendicular to the plane of the film. Such a device may be a magnetoresistive sensor or memory element, such as a TMR (Tunnel Magneto Resistance) or GMR (Giant Magneto Resistance) sensor or memory element. The layer of non-magnetic material, which separates the first and second layer of a ferromagnetic material, is often called "spacer layer" in the case of a GMR sensor or memory element, and "barrier layer" in the case of a TMR sensor or memory element. In the following text, the more general term "separation layer" will be used in order to indicate the spacer layer or the barrier layer of a GMR or a TMR element, respectively.

A device of the type described in the opening paragraph is known, for example, from U.S. Pat. No. 5,465,185, wherein a sensor is shown. The first layer is also called the 'pinned layer' and the second the 'free layer'.

Within the concept of the invention, a 'free layer' is a layer whose magnetization direction is able to change at applied fields with a strength lower than the strength of the field required for changing the magnetization direction of the 'pinned' layer. Such changing may be a nearly free rotation so as to follow the applied magnetic field such as, for example, in sensors or a changing between two anti-parallel states such as, for example, in memory elements.

It is often preferred that the elongated field-sensitive layer, when used in a magnetoresistive element for GMR devices in which a sensing current is parallel to the longitudinal direction, has a relatively large ratio of the length (l) over the width (w) of the layer, and thus forming a stripe. Such a ratio leads to a large resistance of the stripe, and hence, for a given sense current $I_{sense}$, a given relative resistance change $\Delta R/R$ and a given sheet resistance $R\uparrow$, to a large voltage difference between the two extreme states of the element:

$$\Delta V/V = (l/w) \cdot \Delta R/R \cdot R\uparrow \cdot I_{sense} \quad (1)$$

However, such devices with a l/w ratio>1, and especially when having a large t(thickness)/w(width) ratio, prove to have a relatively large field that is required to change the magnetization direction of the free layer. In practice this hampers, for example, the use of GMR spin valves as MRAMs (Magnetic Random Access Memories), because large currents would be required to switch the element, leading to the necessity to use a transistor which is much larger than the magnetic element itself. Another example is the application of AMR and GMR sensors for measuring angles, using an elongated, preferably long and narrow stripe shaped MRE (magnetoresistive Element) (i.e. one having a l/w ratio>1) and more preferably having a large t(thickness)/w(width) ratio. A small and preferably zero net magnetic anisotropy is required, as the magnetization of such a sensor should be saturated for all directions of the (moderate) applied field to enable an accurate angle reading to be performed.

The above equation (1) refers to the situation with the current in the plane of the layers. Recently sensor or memory element structures in which the current is directed perpendicular to the plane of the layers have attracted much attention. Examples are spin tunneling structures (a sandwich structure of two ferromagnetic layers with an oxidic tunneling barrier in between). For these structures no large l/w ratio is required from the point; of view of output voltage. However, the need for a large l/w ratio may nevertheless arise in specific sensor (such as read heads) or magnetic element designs.

The problem discussed above becomes particularly serious upon the miniaturization of sensor and memory elements to a scale at which stripe widths enter the nanometer range (w<1 μm).

SUMMARY OF THE INVENTION

It is an object of the invention to provide a device with a reduced net magnetic anisotropy and/or reduced switching field.

To this end, a device in accordance with the invention is characterized in that the field-sensitive ferromagnetic layer comprises a sandwich structure comprising two magnetic layers, with parallel easy magnetization axes due to the magnetocrystalline anisotropy, and with opposite magnetization directions due to anti-ferromagnetic coupling by a non-magnetic layer 3 separating the two layers 1 and 2, while the magnetization directions due to the magnetocrystalline anisotropy for the two magnetic layers are directed transversely to the longitudinal axis of the field-sensitive ferromagnetic layer.

Terms known to the person of skill in the art are used in the present specification. Some of these are summarized herebelow. The layer of non-magnetic material, which separates the first and second layer of a ferromagnetic material, is often called "spacer layer" in the case of a GMR sensor or memory element, and "barrier layer" in the case of a TMR sensor or memory element. In the following text, the more general term "separation layer" will be used in order to indicate the spacer layer or the barrier layer of a GMR or a TMR element, respectively. Magnetocrystalline anisotropy is the dependence of the (free) energy of a ferromagnetic material on the direction of magnetization of the material, resulting from the internal structure in the material. The total magnetic anisotropy of a ferromagnetic body such as a layer is the result of magnetocrystalline anisotropy, plus a contribution from the shape anisotropy of the body. The shape anisotropy is due to the dependence of the total energy in the magnetostatic field due to the magnetization of the body. The external shape of the body defines preferred directions of magnetization of the body. Magnetic anisotropy creates a situation in which the total energy of the body is lowest when the magnetization direction is parallel or antiparallel to one specific direction, or to several directions which are equivalent from the point of view of the symmetry of the body. Such a direction is called an easy axis direction. For layer structures the shape anisotropy is such that the preferred magnetization directions are confined to the plane of the layer or of a stock of layers (a film). This is a situation of application for a number of embodiments in this patent application (i.e.: there is no contribution from magnetocrystalline anisotropy which more than counteracts the shape anisotropy). In addition, the magnetization within the plane of the layer can have one or more easy directions. In a number of embodiments in this patent application the situation is considered in which the magnetocrystalline anisotropy of the magnetic free layer is uniaxial, i.e., in which there is only one preferred easy direction with the plane of the layer (film). This situation can be created, e.g., by growth of the layer (film) in a magnetic field parallel to the required easy axis direction, or by growth of a layer (film) on a substrate on which the magnetic layer (film) develops an internal structure which gives rise to the required uniaxial symmetry.

By patterning a thin ferromagnetic layer (film) in the form of a narrow stripe, using e.g. lithography, shape anisotropy gives rise to a preferred magnetization direction parallel to the length direction of the stripe.

The invention has a number of advantages:
1. The large switching field in conventional devices is caused by a relatively large shape anisotropy.
2. Providing a sandwich structure comprising two ferromagnetic layers, coupled anti-ferromagnetically by a preferably thin non-magnetic layer, the easy magnetization direction for the two magnetic layers being directed perpendicularly to the longitudinal axis of the field-sensitive layer, leads to a decrease of the shape anisotropy field, compared with conventional devices, because the effective saturation magnetization of the pair of anti-ferromagnetically coupled layers is smaller than that for a single layer. The proper expression for the effective shape anisotropy field $H_{shape,eff}$ for an infinitely long stripe (l/w infinite) becomes:

$$H_{shape,eff} = (t_1 \cdot M_{sat,1} - t_2 \cdot M_{sat,2})/w \qquad (2)$$

where $t_1$, $(M_{sat,1})$, and $t_2$, $(M_{sat,2})$ are the layer thicknesses (saturation magnetization) of the magnetic layers 1 and 2, respectively. The layer numbering is such that $t_1 \cdot M_{sat,1} > t_2 \cdot M_{sat,2}$. Thus the effects of the two layers are of opposite sign and counteract each other, giving a compensating effect. It has been assumed that the anti-ferromagnetic coupling across the separation layer is very strong, as compared with the shape anisotropy field. In practice, this can be realized using, for example, subnanometer Ru or Rh layers. For a finite length 1, the shape anisotropy field is generally smaller, but the effect of compensation still applies.
3. Providing a sandwich structure comprising two magnetic layers with parallel easy magnetization axes due to the magnetocrystalline anisotropy and with opposite magnetization directions due to anti-ferromagnetic coupling by a non-magnetic layer 3 separating the two layers 1 and 2, while the magnetization directions due to the magnetocrystalline anisotropy for the two magnetic layers is directed perpendicularly to the longitudinal axis of the stripe leads to an increase of the effective magnetocrystalline anisotropy field $H_{MCA}$, as compared with conventional devices, because the anisotropy energy has increased with the addition of a second layer, whereas the effective magnetization of the sandwich has decreased. Assuming, again, that the anti-ferromagnetic coupling across the separation layer is very strong, the proper expression for the effective magnetocrystalline anisotropy field $H_{MCA}$ becomes:

$$H_{MCA} = 2(t_1 \cdot K_1 + t_2 \cdot K_2)/\mu_0(t_1 \cdot M_{sat,1} - t_2 \cdot M_{sat,2}) \qquad (3)$$

where $K_1$, and $K_2$ are the anisotropy constants for layers 1 and 2, respectively.

The simultaneous occurrence of the latter two effects leads to a reduction of the total net effective anisotropy field because the easy axis direction due to the shape anisotropy field and the magnetocrystalline anisotropy field are perpendicular to each other. It is remarked that in general for a sensor the applied field to be measured is perpendicular to the direction of the effective anisotropy field, and that in the case of an MRAM in general the applied field used for switching must contain a component that is parallel to the anisotropy field. Preferably, the ratio of the shape anisotropy field $H_{shape,eff}$ and the magnetocrystalline anisotropy field $H_{MCA}$ $$H_{shape,eff}/H_{MCA} \text{ (see equations 2 and 3)} = 0.5\ \mu_0(t_1 \cdot M_{sat,1} - t_2 \cdot M_{sat,2})^2/(w \cdot (t_1 \cdot K_1 + t_2 \cdot K_2)) \qquad (4)$$

lies between 0.5 and 1.5. The net effective anisotropy field is then greatly reduced.

As is apparent from the equations and will be exemplified by embodiments, the different functional dependences of the shape anisotropy field and the magnetocrystalline anisotropy field on the ratio of the thicknesses $t_1/t_2$ allow such conditions to be fulfilled by a proper choice of the ratio of thicknesses $t_1$ and $t_2$ or the ratio f $t_1 \cdot M_{sat,1}/t_2 \cdot M_{sat,2}$.

These and further aspects of the inventions will be apparent from and elucidated with reference to the embodiments described hereafter.

BRIEF DESCRIPTION OF THE DRAWING

In the drawings the following embodiments are shown.

The Figures are diagrammatic and not drawn to scale and corresponding parts have generally been given the same reference numerals.

DESCRIPTION OF THE PREFERRED EMBODIMENTS

Figure 1:
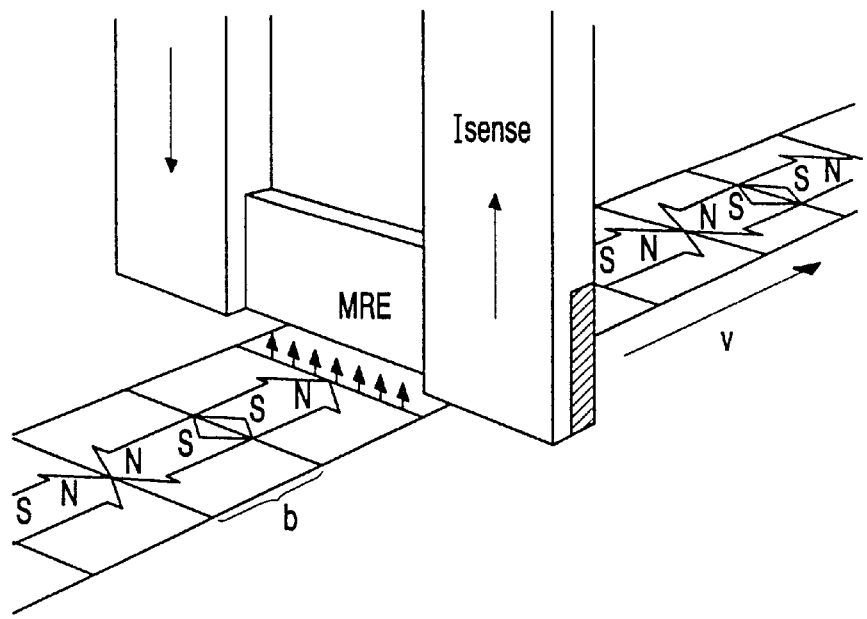
FIGS. 1, 2 and 3 diagrammatically show a sensor in accordance with the invention FIG. 4A diagrammatically and in cross-section shows a further embodiment of a device in accordance with the invention.
Figure 2:
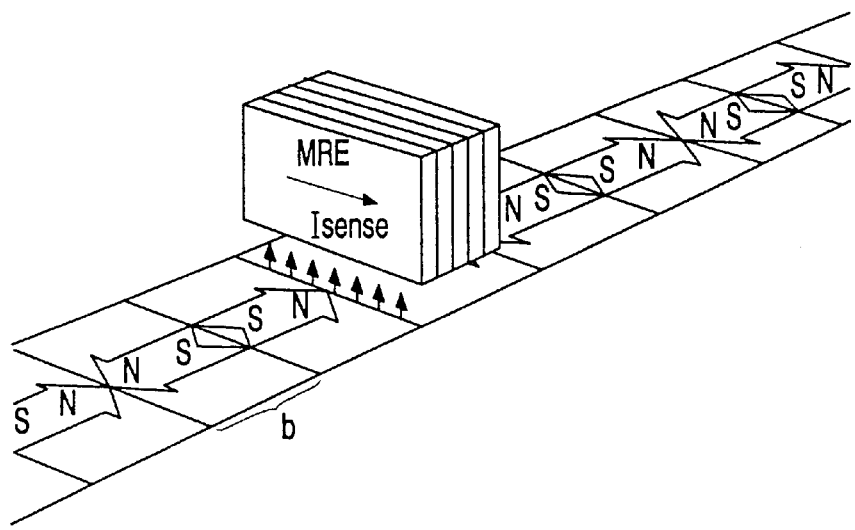
Figure 3:
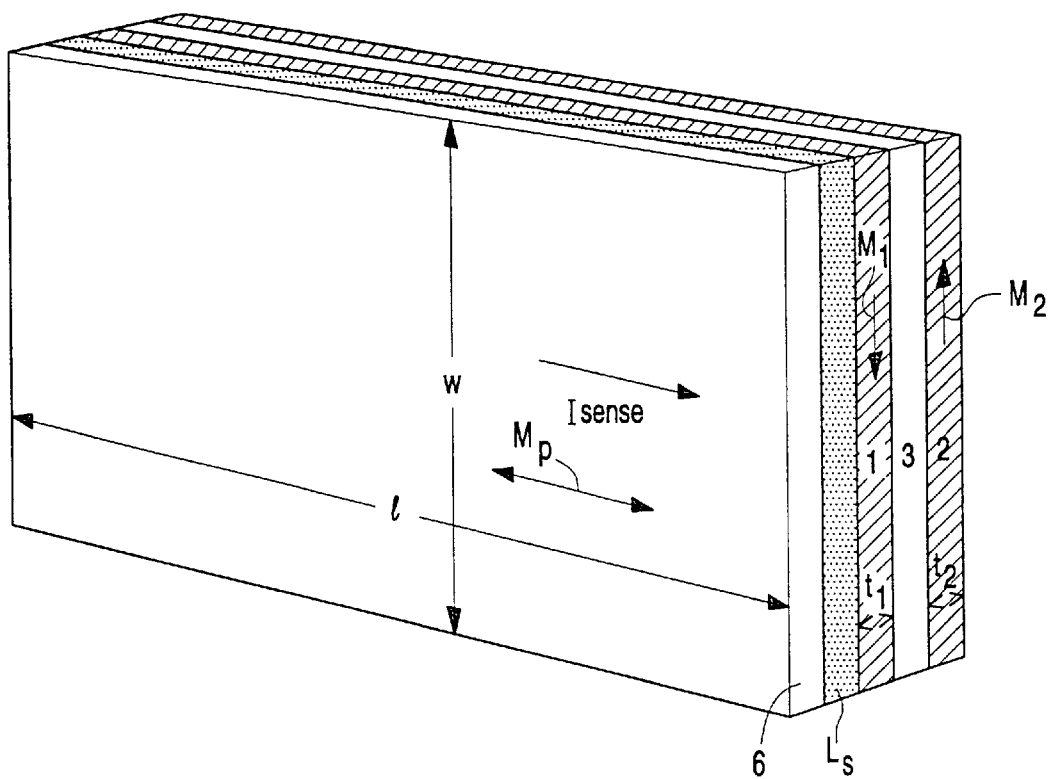

FIGS. 1, 2 and 3 diagrammatically show the structure, in increasing detail, of a GMR sensor device (reading head) having a magnetoresistive element (MRE). As shown in FIG. 3, the MRE comprises a 'pinned' layer 6, and a 'free' layer, i.e. a layer of which the magnetization is free to change direction, in dependence on the ambient magnetic field, and all separation layer $L_s$. The 'free' layer comprises a sandwich structure with two layers 1 and 2 with parallel easy magnetization axes due to the magnetocrystalline anisotropy and with opposite magnetization directions (shown in FIG. 3 by means of arrows $M_1$ and $M_2$) anti-ferromagnetically due to anti-ferromagnetic coupling by a non-magnetic layer 3. The magnetization direction $M_p$ (pinned) of the pinned layer 6 is also shown in the Figure. A 'free' layer within the concept of the invention is understood to be a layer (which may be composed of sublayers 1,2,3) which is more 'free' than the pinned layer. The magnetization direction of the 'free' layer may either be nearly free to rotate such as, for example, in a sensor (as in FIG. 1, 2 3), or 'free' to change between two anti-parallel states, meaning that an applied magnetic field of relatively small magnitude (compared with the magnitude of a magnetic field to 'unpin' the pinned layer) may cause a change in the magnetization direction.

Returning now to FIG. 2, a magnetic medium having a pattern of domains b representing a sequence of bits moves in a direction v in respect of the MRE. When a transition between two domains passes under the MRE, the ambient magnetic field changes strongly, inducing a change in the magnetization direction of the free layer (1,2,3) and thereby changing the resistance across the MRE. This change is recorded by means of a sensing current $I_{sense}$. The direction of the sensing current $I_{sense}$ is indicated in FIGS. 1, 2 and 3. The sensing current $I_{sense}$ runs parallel to the longitudinal axis (1) of the strips. Indicated is the length 1 of the MRE along the direction of the sensing current and the width w and the thicknesses $t_1$ and $t_2$ of the layers 1 and 2. The greater the sensitivity of the free layer to ambient magnetic fields, the larger the signal will be, and in general the smaller the domains b can be made. For the element it holds that l/w >1, i.e. the element is elongated with a longitudinal direction 1.

Figure 4A:
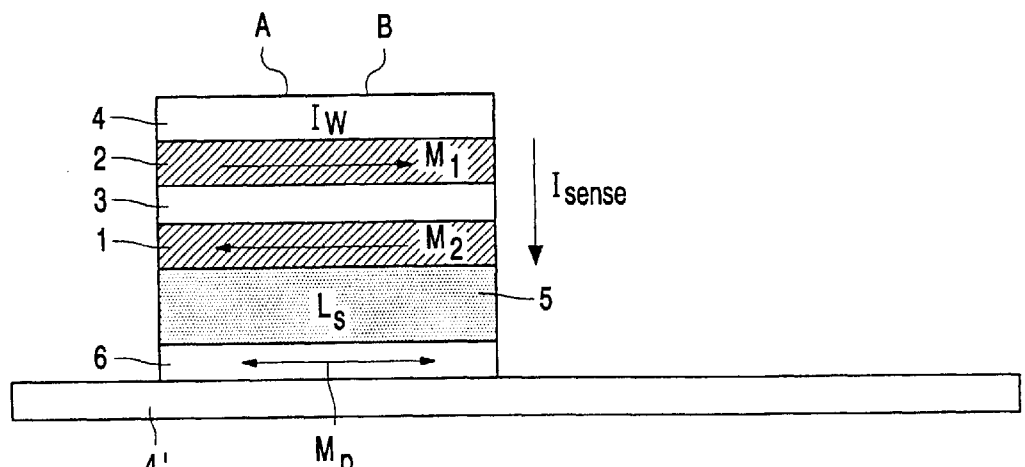
FIG. 4B diagrammatically and in plan view shows a device as illustrated in FIG. 4A.
FIG. 4C diagrammatically shows a side view of a device as illustrated in FIG. 4A.
Figure 4B:
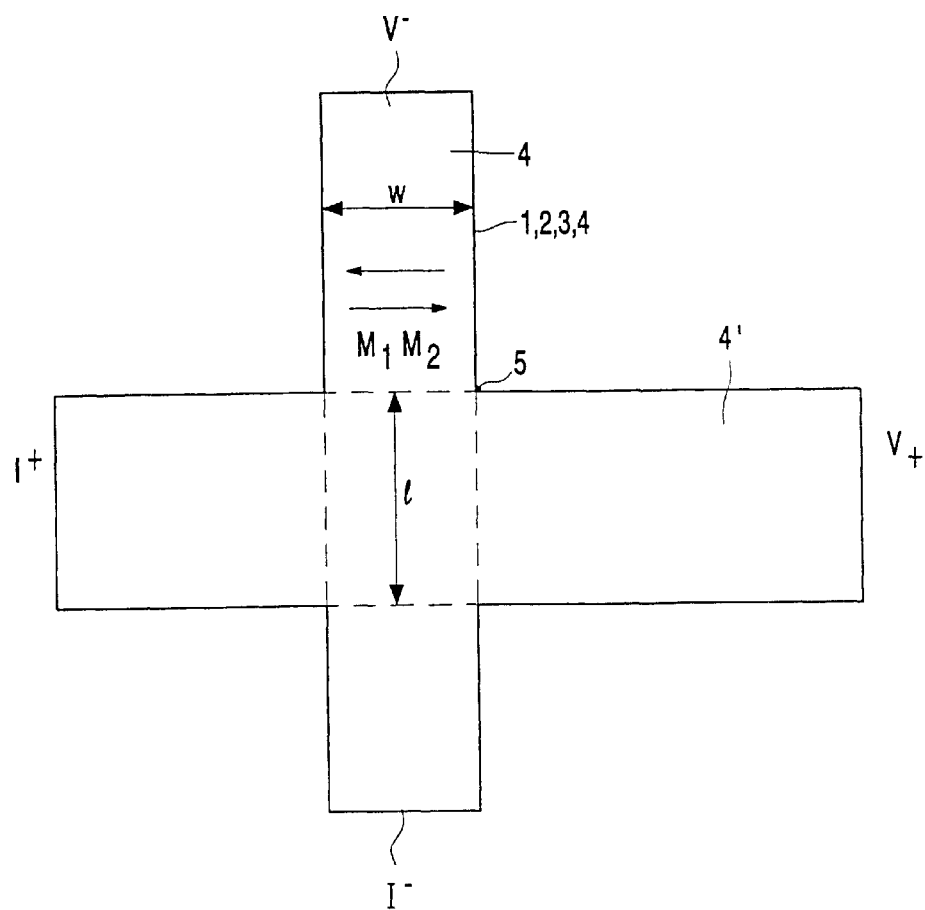
Figure 4C:
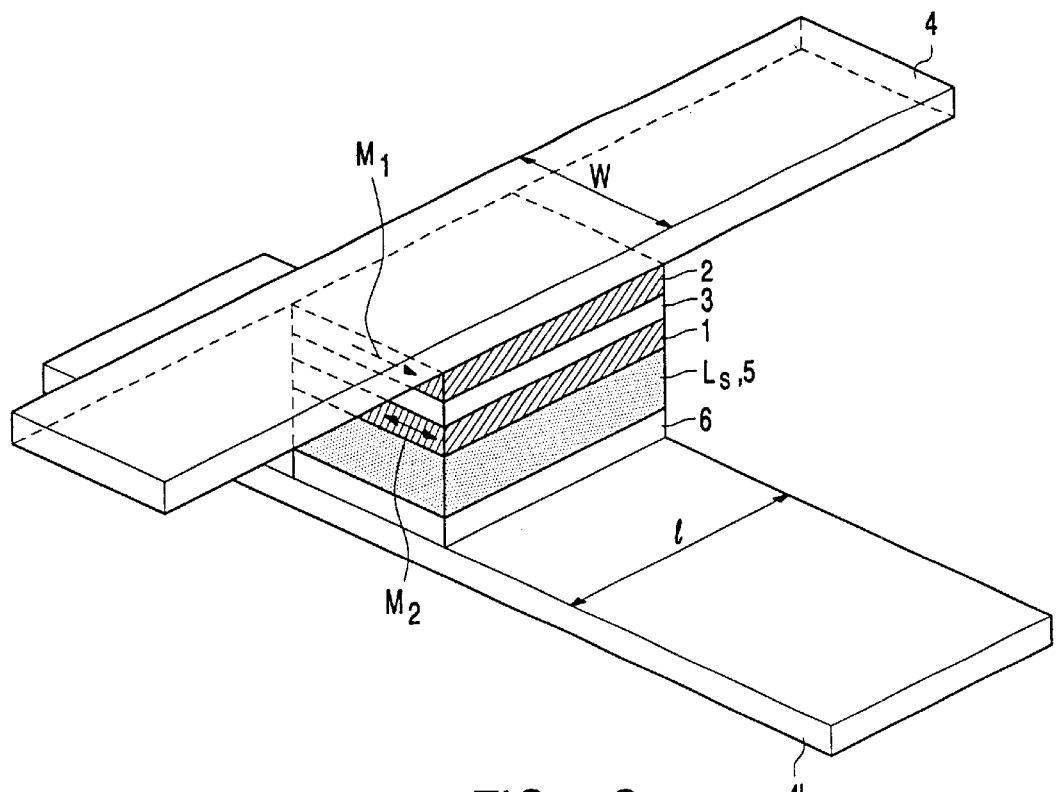

FIGS. 4A, 4B and 4C show an embodiment of a magnetic memory based on the GMR effect in which the free layer (comprising a sandwich structure of layers 1,2,3) and a conducting layer 6 are vertically (i.e. transversely to the plane of the layers) separated by a separation layer $L_s$, in the Figures also referenced 5. The longitudinal direction a of the free layer and the direction w transverse to this axis is indicated in FIG. 4B. A conducting layer 4 is provided on top of layer 2, a conducting layer 4' is provided on the bottom. The latter function (bottom conductor) may be fulfilled by the layer 6 in other embodiments. The magnetization $M_p$ of the pinned ferromagnetic layer (6) is fixed, the magnetization direction of the layer at the other side of the separating layer 5, i.e. the magnetization direction of free layer 1, can be switched between two directions (i.e. parallel and anti-parallel to the fixed magnetization of layer 6) by a writing current $I_w$ through conductor 4. Due to the GMR-effect, the resistance for both configurations is different, depending on the net magnetization direction of sublayers 1–3. The state of the memory ('1' or '0') can thus be determined by measuring the resistance of the GMR system. To this end, the relation between a sensing current $I_s$ and an applied voltage can be measured. A sensing current $I_{sense}$ perpendicular to the layer is used to measure the magnetoresistance and thereby measure the status of the memory, element (a '0' or a '1'). The writing current $I_w$ needed to switch the element, i.e. to write data in the element, is dependent on the net field needed to switch the magnetic state of the memory element. The larger the switching field, the more current is needed. Large currents hamper the use of such elements. Therefore, reducing the magnitude of the net anisotropy or switching field is advantageous.

Figure 5:
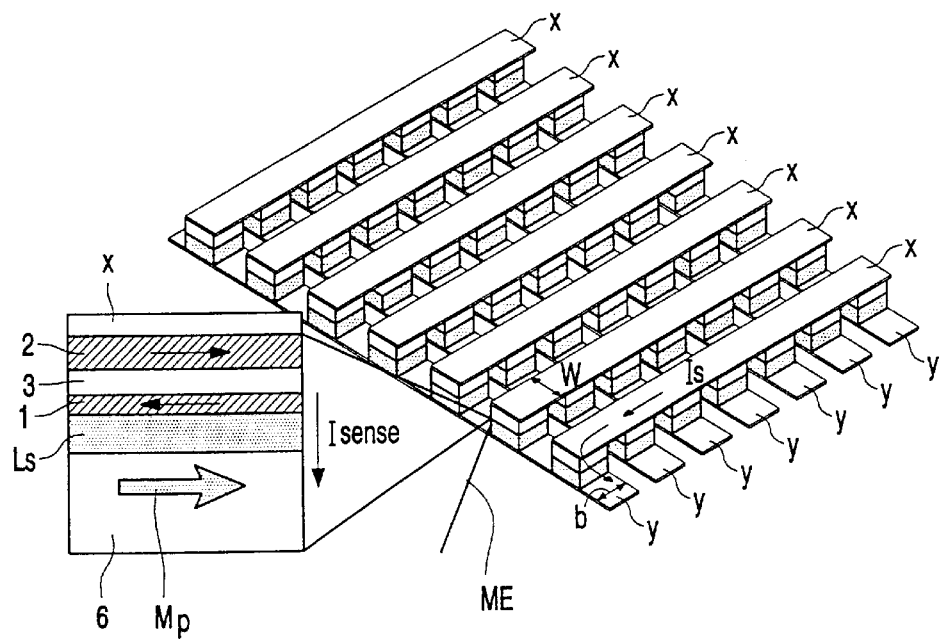
FIG. 5 shows a further example of a device in accordance with the invention, namely a MRAM.

FIGS. 4A, 4B and 4C show a memory element based on the GMR effect. Memory elements can also be made based on the TMR (Tunnel MagnetoResistance effect). A device having a number of such memory elements is diagrammatically shown in FIG. 5. A magnetic memory (based on the TMR effect) consists in its simplest form of two ferromagnetic layers separated by a non-magnetic non-metallic separation layer. FIG. 5 diagrammatically shows a MRAM based on the TMR effect. It comprises electrodes x and y in between which magnetic memory elements (ME) are provided. Said magnetic memory element, according to the invention, comprises a 'fixed' layer 6 with pinned magnetization $M_p$, a separation layer $L_s$ and a 'free' layer, the latter 'free' layer comprising a sandwich structure with two layers (1,2) with parallel easy magnetization axes due to the magnetocrystalline anisotropy, separated and with opposite magnetization directions due to anti-ferromagnetic coupling by a non-magnetic non-metallic layer 3 separating the two layers 1 and 2. In the example of FIG. 5, the free and fixed layer and the separation layer $L_s$ are stacked on top of each other. The sensing current $I_{sense}$ runs perpendicularly to the plane of the layers. A relatively large writing current $I_w$ through electrodes x generates a switching field. The switching field is usually decreased by means of running a current through electrodes y, such that at the cross of two electrodes a magnetic field is generated of sufficient magnitude to switch the magnetization direction of the free layer. Again, the smaller the required strength of the switching field, the better it is in view of the requirement of low switching currents. It is remarked that in view of data stability the required switching field needs to have a lower limit or threshold given by the strengths of fields that could arise from other sources, such as stray fields and stray currents.

Figure 6A:
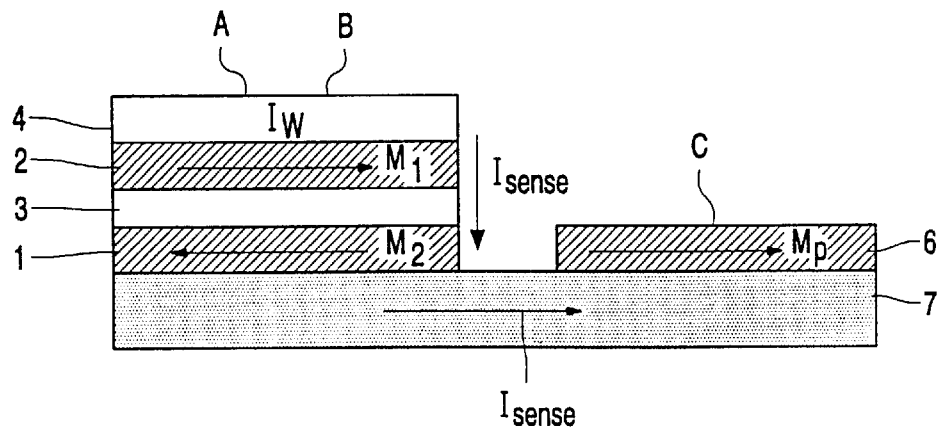
FIG. 6A diagrammatically and in cross-section shows an embodiment of a device in accordance with the invention, namely a lateral magnetic memory.
Figure 6B:
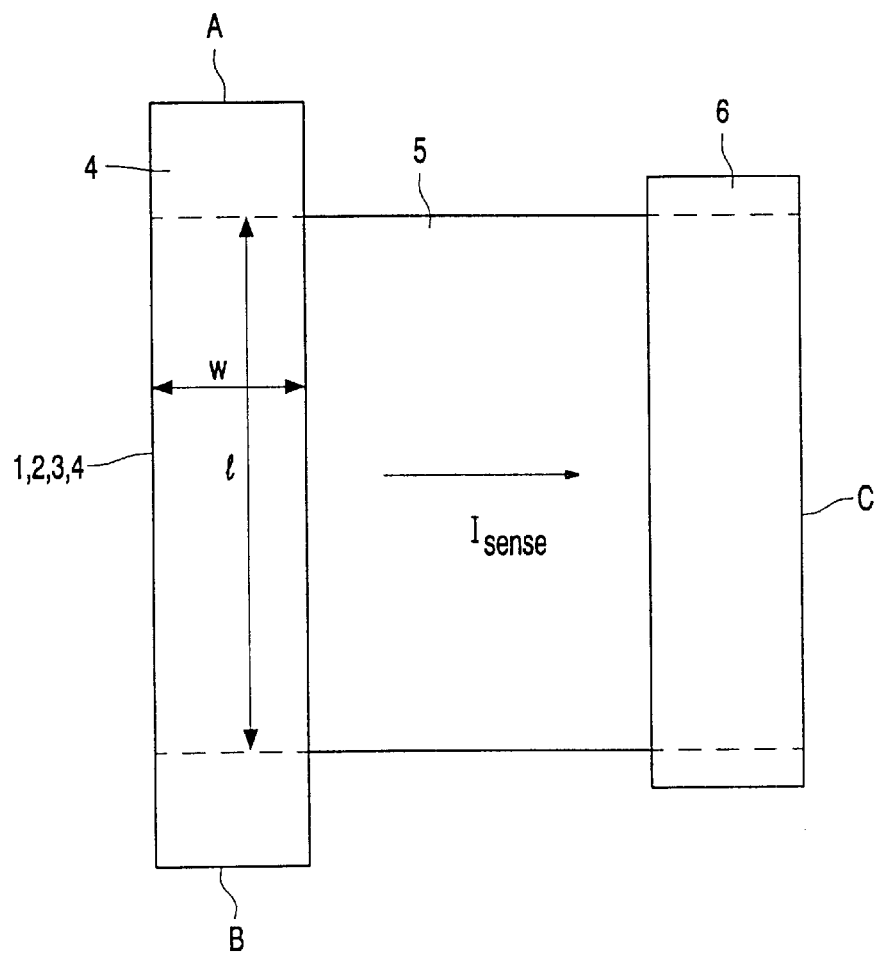
FIG. 6B diagrammatically and in plan view shows a device as illustrated in FIG. 6A.

FIGS. 6A and 6B show a lateral memory element in which the free layer (comprising a sandwich structure of sublayers 1, 2, 3) and the fixed layer 6 are laterally separated by the separating layer 7. The sensing current runs through the free layer (1,2,3) and through the separating layer 6 to the pinned layer 6, for example via leads A (or B) to lead C. A writing current can be run through the conductor 4, via leads A and B. As explained above, the invention is based on the insights that 1. The large switching field in conventional devices is caused by a relatively large shape anisotropy.
2. Providing a sandwich structure comprising two ferromagnetic layers, coupled anti-ferromagnetically by a thin non-magnetic layer, the easy magnetization direction for the two magnetic layers being directed perpendicular to the longitudinal axis of the field-sensitive layer leads to a decrease of the shape anisotropy field $H_{shape,eff}$, as compared with conventional devices.
3. Providing a sandwich structure comprising two magnetic layers with parallel easy magnetization axes due to the magnetocrystalline anisotropy, and with opposite magnetization directions due to anti-ferromagnetic coupling by a non-magnetic non-metallic layer 3 separating the two layers 1 and 2, while the easy magnetization direction due to the magnetocrystalline anisotropy for the two magnetic layers is directed perpendicularly to the longitudinal axis of the stripe leads to an increase of the effective magnetocrystalline anisotropy field $H_{MCA}$, as compared with conventional devices.

Since the easy axis direction due to shape anisotropy field and the magnetocrystalline anisotropy field are perpendicular to each other, the simultaneous occurrence of the latter two effects leads to a strong reduction of the net total effective anisotropy field $H_{a,net}$.

Figure 7:
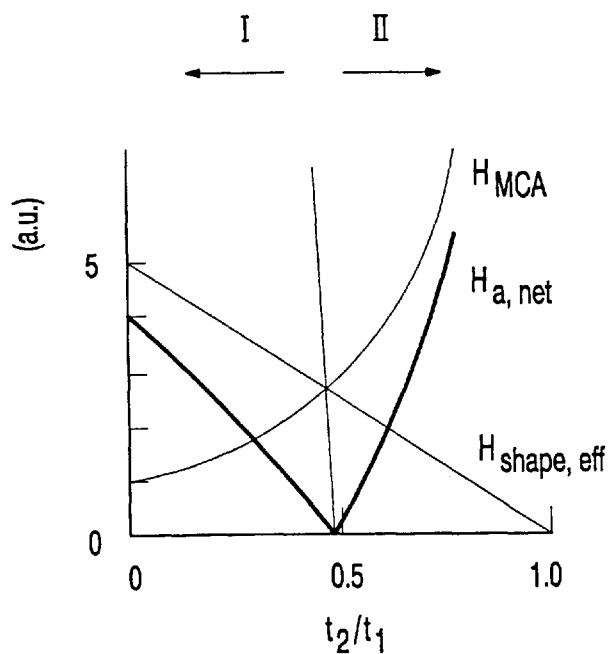
FIG. 7 shows in a graphical form the relation between the ratio $t_2/t_1$ and the effective anisotropy or switching field $H_{a,net}$.

These effects are illustrated in FIG. 7. FIG. 7 shows the effect of adding an anti-ferromagnetically coupled second layer 2 with the same composition as layer 1 ($K_1=K_2$, $M_{sat,1}=M_{sat,2}$), separated by a coupling layer 3, to the first layer 1 on the switching field of the stack of layers 1, 2, 3. For the initial situation ($t_2=0$), i.e. the second layer 2 is not present, $H_{shape,eff}=5\ H_{MCA}$, which is not an uncommon situation for such a configuration. FIG. 7 should be interpreted as follows. Shape anisotropy promotes magnetization parallel to the longitudinal axis 1, whereas the magnetocrystalline anisotropy of the materials employed (because the easy axes due to magnetocrystalline anisotropy are perpendicular to the longitudinal axis) promotes magnetization perpendicular to the longitudinal axis 1. The net effective anisotropy field $H_{a,net}$ is given by the difference $|H_{shape,eff}-H_{MCA}|$. When $(H_{shape,eff}-H_{MCA})>0$ (region I), $|H_{shape,eff}-H_{MCA}|$ denotes the field that is required to saturate the magnetization by means of an applied magnetic field perpendicular to the long axis, the net easy axis direction being parallel to the longitudinal axis 1. When $(H_{shape,eff}-H_{MCA})<0$(region II), $|H_{shape,eff}-H_{MCA}|$ denotes the field that is required to saturate the magnetization. by means of an applied magnetic field parallel to the longitudinal axis, the net easy axis direction being perpendicular to the longitudinal axis 1. FIG. 7 makes clear that it is possible to perfectly balance the two anisotropy fields to achieve zero net anisotropy, since at $t_2/t_1$=approximately 0.45 it holds that $|H_{shape,eff}-H_{MCA}|=0$ or alternatively to choose the net effective anisotropy field at will by selecting the proper thickness of the second magnetic layer 2 for a given thickness of layer 1. Zero (or near zero) net anisotropy may be advantageous for certain embodiments in which extremely sensitive sensors are needed. In the case of a memory element, preferably the thicknesses and properties of the layers are chosen such that the net effective anisotropy field $H_{a,net}$ is not precisely zero but, for example, between approximately 50 and 5% of the magnetocrystalline anisotropy field of a single layer. In this manner the ease of switching is greatly improved (by for example a factor 2 to 20) while the switching field is not reduced to such a small field that any field will switch the element. Such a 'hypersensitivity' in memory elements can lead to an unwanted change of data. A very substantial reduction of the net anisotropy is obtained when $0.25<t_1M_{sat,1}/t_2M_{sat,2}<0.70$.

Let us consider the example of a material containing a t=8 nm thick single permalloy layer as the switching layer. This situation is typical of a GMR exchange biased spin valve material. For long stripes the shape anisotropy field is given by fair approximation by the expression $$H_{shape}=(t/w)M_{sat} \qquad (5)$$

where $M_{sat}$ is the saturation magnetization of permalloy (800 kA/m). For a stripe width of w=1 μm it follows that $H_{shape}$=6.4 kA/m. Reduction of the infinite length of the stripe to the finite value of l=3 μm (i.e. l/w=3) only slightly reduces the shape anisotropy field, viz. to $H_{shape}\approx 5$ kA/m, as is revealed by a detailed calculation. These shape anisotropy fields are large with respect to the magnetocrystalline anisotropy fields (0.4–2 kA/m) that can be induced by growth of the (Ni—Fe—Co) alloys used in practice in a magnetic field. Such effects can be realized by growth in a magnetic field along this direction. For a substantial further reduction of the switching field the use of a second layer as in the present invention is needed.

The effect of adding a second layer on the magnetoresistance depends on the type of system. For exchange biased spin valve GMR materials, the second layer will give rise to current shunting, thereby decreasing the GMR ratio. This effect can be strongly limited by choosing the second layer thinner than layer 1, and by using a highly resistive layer composition. In a spin-tunneling configuration, with the current perpendicular to the plane of the layers, the addition of a second metallic layer is of no consequence to the MR ratio and to the voltage output of the sensor or memory element.

It is important to realize that balancing (or partial balancing) of shape and magnetocrystalline anisotropies occur only if the induced magnetocrystalline anisotropy is transverse to the longitudinal direction 1.

Within the concept of the invention the same idea can be applied to flux guides such as, for example those used in magnetic recording heads. These flux guides are often of elongated shape. By using a sandwich structure comprising two magnetic layers, coupled anti-ferromagnetically by a thin non-magnetic layer, the easy magnetization direction for the two magnetic layers due to magnetocrystalline anisotropy being directed transverse to the longitudinal axis of the layers, the net anisotropy field of the flux guide can be reduced or even be made zero, which greatly improves the flux guiding properties of the flux guide.

Figure 8:
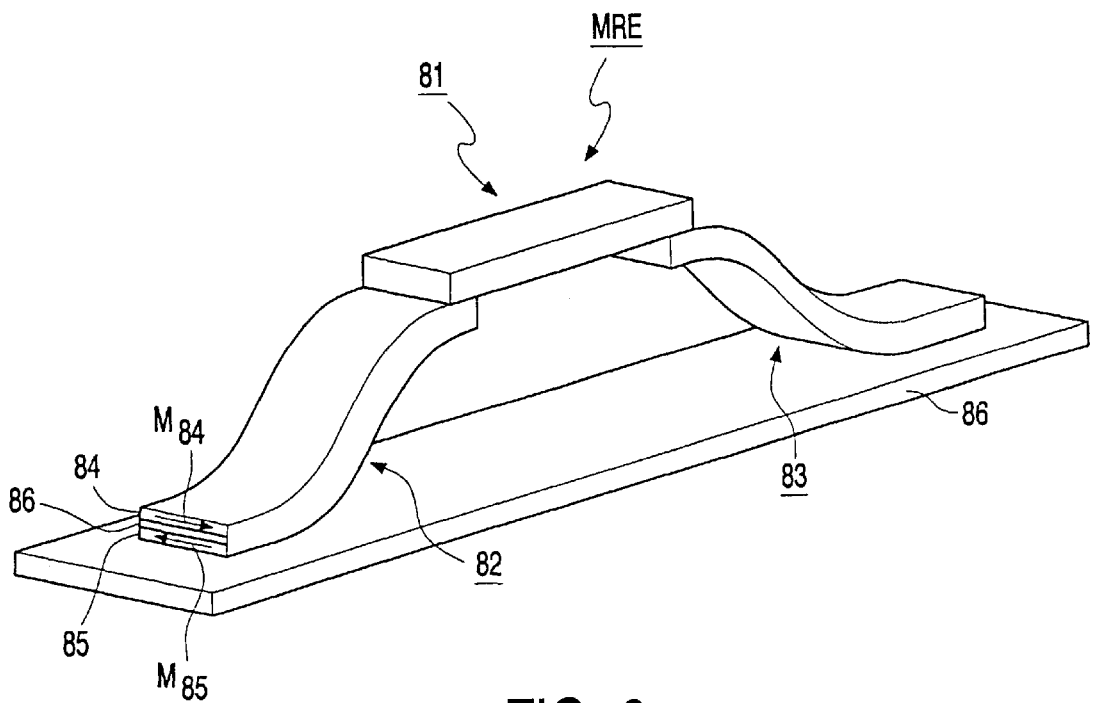
FIG. 8 diagrammatically shows a magnetoresistive element connected to flux guides.

FIG. 8 diagrammatically shows a magnetoresistive element (MRE) (81) connected to two flux guides (82, 83). Each of these elongated flux guides comprises a sandwich structure with two ferromagnetic layers (84, 85) separated by a layer 86, and having an easy magnetization direction due to magnetocrystalline anisotropy ($M_{84}$, $M_{85}$) transverse to the longitudinal axis 1 of the flux guides. This structure may form part of a so-called yoke-type read head which also contains a second flux guide structure which together with the structure formed by elements 81–85 forms a yoke. The flux enters the yoke at the read gap 90 and via the flux guides and the MRE it returns to the medium.

It may be concluded that these structures and their functioning are completely different as compared with known structures and functioning.

In summary, embodiments of the invention can be described by a device or a sensor (MRE) or memory element (ME) having a free (1,2,3) and a fixed or pinned ($M_p$, 6) magnetic layer separated by a separation layer ($L_s$, 5). The free layer comprises a sandwich structure having a sandwich structure comprising two magnetic layers (1,2), coupled anti-ferromagneticallly by a preferably thin non-magnetic layer (3), with parallel easy magnetization axes due to the magnetocrystalline anisotropy, and with opposite magnetization directions due to anti-ferromagnetic coupling by the layer 3 separating the two layers 1 and 2, while the easy magnetization direction for the two magnetic layers (1, 2) due to magnetocrystalline anisotropy is directed transversely to the longitudinal axis (1) of the stripe. In another embodiment, the invention relates to a flux guide which comprises a sandwich structure having a sandwich structure comprising two magnetic layers (1,2), coupled anti-ferromagneticallly by a preferably thin non-magnetic layer (3), the easy magnetization direction for the two magnetic layers (1, 2) due to magnetocrystalline anisotropy being directed transversely to the longitudinal axis (1) of the stripe.

As a sensor element, the device of the invention may be implemented as a sensor system for automotive applications according to techniques known to the person skilled in the art. Also other implementations such as, for example, sensor systems for domestic application may be made.

The sensor system can be a magnetic sensor device or a magnetic read-head such as a GMR thin film head for hard disks or any such system including or not including signal processing electronics for processing the signal of the magnetic characteristic or a measure or derivate thereof. The device of the invention can be made at least partly in a multilayer configuration. It is possible in an embodiment of the invention to integrate the whole sensing system on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. In the front-end process, the multilayer configuration is directly integrated on the chip. The sensor system of the invention can also be an integrated circuit with a memory functionality and an integrated sensing system or an ASIC with an embedded non-volatile magnetic memory element and a sensor system or a chipcard with a sensor system or any such sensor system.

As a memory element, the device of the invention may also be implemented as a data storage system such as a MRAM memory element or a chipcard. The device of the invention can be a magnetic memory element or a magnetic memory device and can also be a computer or an integrated circuit with a memory functionality such as a MRAM, or an ASIC with an embedded non-volatile magnetic memory element, or a chipcard or any such data storage system. The device of the invention can be made at least partly in a multilayer configuration. As such it can be a MRAM structure being integrated on a semiconductor substrate. It can also be non-volatile magnetic memory structure being integrated on a semiconductor substrate.

What is claimed is:

1. A device comprising an elongated field-sensitive ferromagnetic layer (1, 2, 3) of which the magnetization is sensitive to an applied field, said field-sensitive ferromagnetic layer comprising a sandwich structure comprising two magnetic layers (1, 2), the two magnetic layers having parallel easy magnetization axes and being coupled anti-ferromagnetically by a non-magnetic layer 3 separating the two layers the two layers 1 and 2, easy magnetization directions ($M_1$, $M_2$) for the two magnetic layers (1, 2) being directed substantially transversely to a longitudinal axis (I) of the field-sensitive ferromagnetic layer;

the parallel easy magnetization axes are due to magnetocrystalline anisotropy and wherein opposite magnetization directions are present in the magnetic layers due to the anti-ferromagnetic coupling by the non-magnetic layer; and wherein the field-sensitive ferromagnetic layer forms the second layer of a first (6) and a second layer (1, 2, 3) of ferromagnetic material separated by a separation layer of non-ferromagnetic material ($L_s$, 7), the first and second layer being formed such that the magnetization ($M_p$) of the first ferromagnetic layer (6) is maintained in a fixed (pinner) direction in the presence of an applied magnetic field, while the magnetization direction of the second ferromagnetic layer (1, 2, 3) is able to change in the presence of an applied magnetic field, the device comprising means for directing a sensing current ($I_{sense}$) through the elongated field-sensitive ferromagnetic layer in a current direction parallel to the longitudinal axis (I) or perpendicular to the plane of the layers.

2. A device as claimed in claim 1, wherein a ratio of the shape anisotropy field $H_{shape,eff}$ to the magnetocrystalline anisotropy field $H_{MCA}$ lies between 0.5 and 1.5.

3. The device as recited in claim 1, wherein the field-sensitive layer is a free layer of a GMR-structure or a TMR-structure.

4. A device as claimed in claim 1, wherein the device forms a magnetoresistive sensor element.

5. A device as claimed in claim 1, wherein the device forms a magnetoresistive memory element.

6. The device as claimed in claim 1, wherein the separation layer is non-metallic.

* * * * *